US010096587B1

(12) United States Patent
Yu et al.

(10) Patent No.: US 10,096,587 B1
(45) Date of Patent: Oct. 9, 2018

(54) FIN-BASED DIODE STRUCTURES WITH A REALIGNED FEATURE LAYOUT

(71) Applicant: GLOBALFOUNDRIES Inc., Grand Cayman (KY)

(72) Inventors: Mickey Yu, Essex Junction, VT (US); Alain Loiseau, Williston, VT (US); Souvick Mitra, Essex Junction, VT (US); Tsung-Che Tsai, Essex Junction, VT (US); You Li, South Burlington, VT (US); Robert J. Gauthier, Jr., South Burlington, VT (US)

(73) Assignee: GLOBAL FOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/794,688

(22) Filed: Oct. 26, 2017

(51) Int. Cl.
| | |
|---|---|
| *H01L 27/02* | (2006.01) |
| *H01L 27/088* | (2006.01) |
| *H01L 21/8234* | (2006.01) |
| *H01L 23/535* | (2006.01) |
| *H01L 29/06* | (2006.01) |

(52) U.S. Cl.
CPC .. *H01L 27/0207* (2013.01); *H01L 21/823431* (2013.01); *H01L 21/823481* (2013.01); *H01L 23/535* (2013.01); *H01L 27/0886* (2013.01); *H01L 29/0649* (2013.01)

(58) Field of Classification Search
CPC ............. H01L 27/0886; H01L 27/0207; H01L 21/823431; H01L 21/823481; H01L 23/535

See application file for complete search history.

(56) References Cited

U.S. PATENT DOCUMENTS

| | | | |
|---|---|---|---|
| 8,928,083 B2 | 1/2015 | Chang et al. | |
| 9,478,540 B2 * | 10/2016 | Ou | H01L 21/82343 |
| 2013/0292745 A1 | 11/2013 | Liu et al. | |
| 2014/0203378 A1 * | 7/2014 | Ou | H01L 21/82343 257/401 |
| 2017/0194312 A1 * | 7/2017 | Zhou | H01L 21/82381 |

* cited by examiner

*Primary Examiner* — Christine Enad
(74) *Attorney, Agent, or Firm* — Thompson Hine LLP; Anthony Canale

(57) ABSTRACT

Diode structures and methods of fabricating diode structures. First and second gate structures are formed with the second gate structure arranged parallel to the first gate structure. First and second fins are formed that extend vertically from a top surface of a substrate. The first and second fins are arranged between the first gate structure and the second gate structure. A contact structure is coupled with the first fin and the second fin. The contact structure is laterally arranged between the first gate structure and the second gate structure.

20 Claims, 7 Drawing Sheets

US 10,096,587 B1

FIN-BASED DIODE STRUCTURES WITH A REALIGNED FEATURE LAYOUT

BACKGROUND

The present invention relates to semiconductor device fabrication and integrated circuits and, more specifically, to diode structures and methods for fabricating diode structures.

Passive devices such as diodes are frequently included in integrated circuit structures, and are often fabricated during fabrication of other circuit structure components, such as fin-type field effect transistors (FinFETs). As integrated circuit structure sizes and features continue to shrink, new layout designs for diode structures become important to conserve space on wafers and include more devices within smaller spaces on a wafer.

SUMMARY

In an embodiment of the invention, a device structure includes a first gate structure, a second gate structure arranged parallel to the first gate structure, and a first fin and a second fin each extending vertically from a top surface of a substrate. The first and second fins are arranged between the first gate structure and the second gate structure. The device structure further includes a contact structure coupled with the first fin and the second fin. The contact structure is laterally arranged between the first gate structure and the second gate structure.

In an embodiment of the invention, a method includes forming first and second fins each extending vertically from a top surface of a substrate, depositing a gate material layer over the substrate, patterning the gate material layer to form a first gate structure and a second gate structure arranged parallel to the first gate structure, and epitaxially growing a semiconductor material from the first fin and the second fin after the gate material layer is patterned. The first and second fins are arranged between the first gate structure and the second gate structure. The semiconductor material is laterally arranged between the first gate structure and the second gate structure.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 7A is a top view of the structure in which FIG. 7 is taken generally along line 7-7.

DETAILED DESCRIPTION

Figure 1:
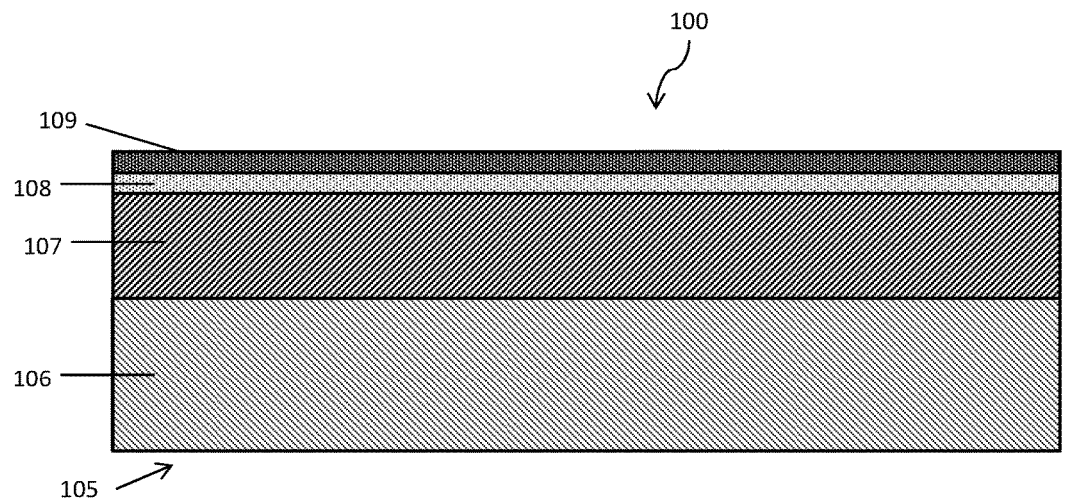
FIGS. 1-12 are cross-sectional views of a structure at successive fabrication stages of a processing method in accordance with embodiments of the invention.

With reference to FIG. 1 and in accordance with embodiments of the invention, a structure 100 is depicted including a substrate 105 with a doped well 106 and a semiconductor layer 107. Doped well 106 may be formed, for example, by implanting a dopant in a semiconductor wafer or layer of structure 100. In an embodiment, the doped well 106 may be an n-well that is doped with an n-type dopant. Semiconductor layer 107 may be formed on doped well 106, for example, via epitaxial growth of a semiconductor material, such as intrinsic or doped silicon, from the top surface of the doped well 106. Structure 100 also includes one or more pad dielectric layers 108, 109 disposed over semiconductor layer 107. Pad dielectric layer 108 may be composed of, for example, an oxide material (e.g., silicon dioxide), and pad dielectric layer 109 may be composed of, for example, a nitride material (e.g., silicon nitride).

Figure 2:
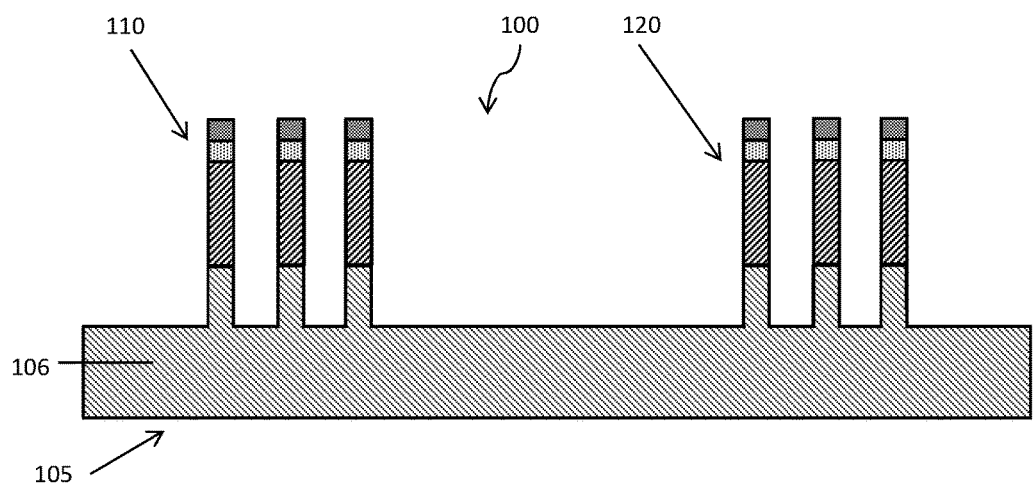

With reference to FIG. 2 in which like reference numerals refer to like features in FIG. 1 and at a subsequent fabrication stage of the processing method, a fin structure 110 is formed that includes fins 111, 112, 113 projecting from and extending above a substrate 105. Another fin structure 120 is formed that includes fins 121, 122, 123 projecting from and extending above substrate 105. Fin structure 110 has an outer fin 111 and an outer fin 112, and may have one or more interior fins 113 between the outer fins 111, 112. Similarly the fin structure 120 has an outer fin 121, an outer fin 122, and may have one or more interior fins 123 between the outer fins 121, 122. The number of fins in either fin structure 110 or fin structure 120 may be smaller or larger than shown depending on particular device requirements.

The fins 111, 112, 113 and the fins 121, 122, 123 may be formed by patterning the material of semiconductor layer 107 and a thickness of the material of doped well 106 using a sidewall imaging transfer (SIT) process, self-aligned double patterning (SADP), or self-aligned quadruple patterning (SAQP). Each of the fins 111, 112, 113 and each of the fins 121, 122, 123 has an upper section formed from the material of semiconductor layer 107 and a lower section formed from the doped semiconductor material of doped well 106. The portion of the doped well 106 that is not patterned during fin formation is located in the substrate 106 below the fins 111, 112, 113 in the substrate area that includes fin structure 110 and below the fins 121, 122, 123 in the substrate area that includes fin structure 120.

Figure 3:
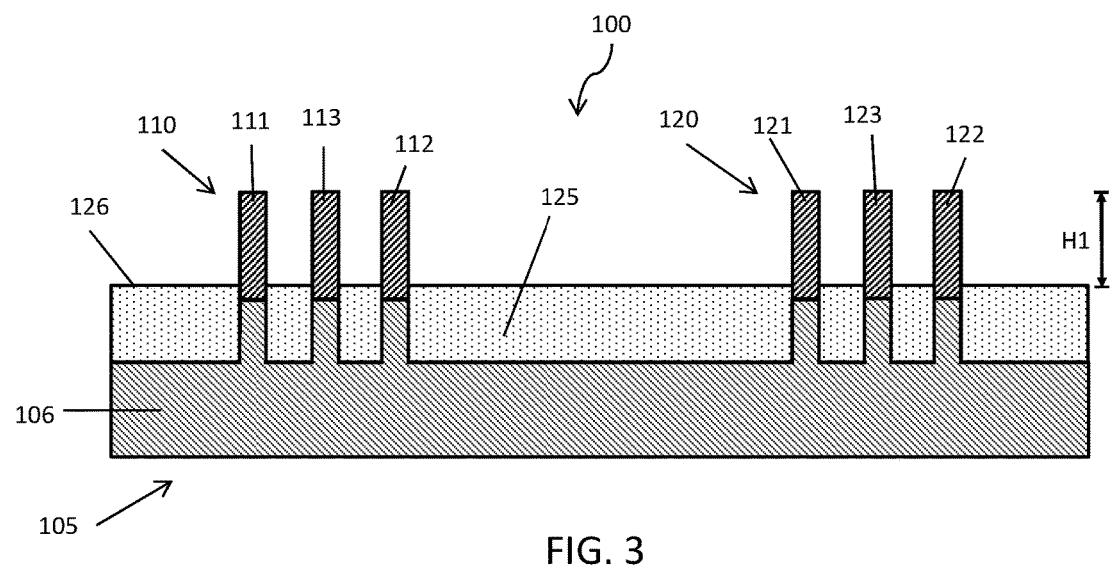

With reference to FIG. 3 in which like reference numerals refer to like features in FIG. 2 and at a subsequent fabrication stage of the processing method, a shallow trench isolation region 125 is formed between and around the fin structure 110 and the fin structure 120, as well as between fins 111, 112, 113 of fin structure 110 and between fins 121, 122, 123 of fin structure 120. The shallow trench isolation region 125 surrounds the fins 111, 112, 113 and also surrounds the fins 121, 122, 123. Shallow trench isolation region 125 may be formed by depositing a blanket layer of a dielectric material, such as an oxide-based dielectric material (e.g., silicon dioxide), over structure 100 followed by planarization of the dielectric material, such as by a chemical-mechanical planarization (CMP) process, that is controlled to terminate at top surfaces of pad dielectric layer 109 over fin structures 110 and 120, and then recessing the dielectric material with an etching process to reveal active regions of the fins 111, 112, 113 and active regions of the fins 121, 122, 123. Pad dielectric layers 108 and 109 may be removed from fins 111, 112, 113 and fins 121, 122, 123 to expose their top surfaces.

Sections of fins 111, 112, 113 and sections of the fins 121, 122, 123 that are formed from doped well 106 are at least partially embedded in the shallow trench isolation region 125, as shown in FIG. 3, and may be arranged beneath the top surface 126 of the shallow trench isolation region 125. Respective sections of the fins 111, 112, 113 and the fins 121, 122, 123 may be arranged above the top surface 126 of the shallow trench isolation region 125 and have heights, H1, relative to the top surface 126. In an embodiment, the sections of fins 111, 112, 113 and the sections of fins 121, 122, 123 that are formed from doped well 106 are completely embedded in the shallow trench isolation region 125.

Figure 4:
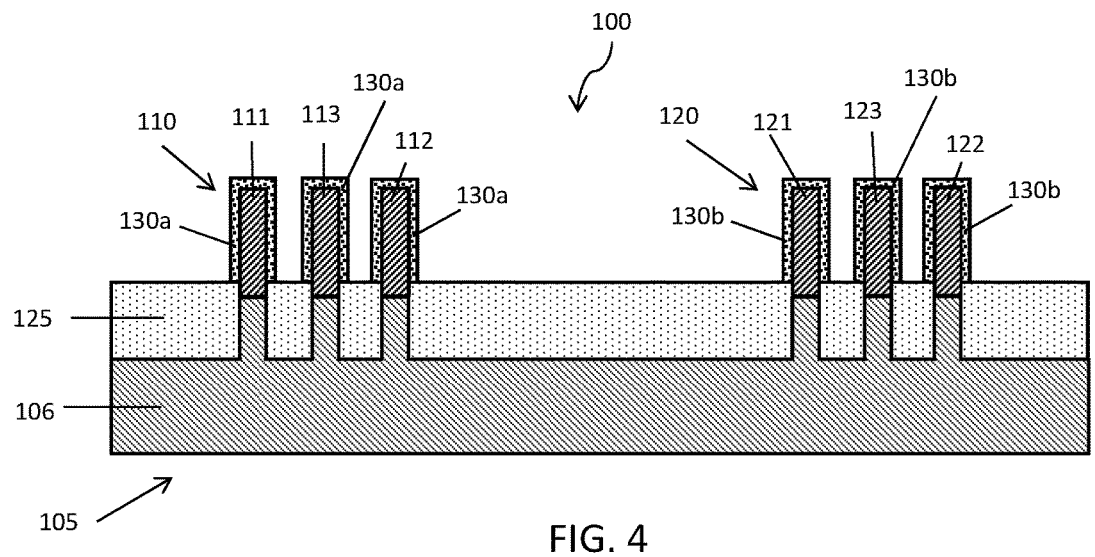

With reference to FIG. 4 in which like reference numerals refer to like features in FIG. 3 and at a subsequent fabrication stage of the processing method, dielectric layers 130a are formed on top surfaces and on sidewalls of the fins 111, 112, 113 of fin structure 110 and dielectric layers 130b are formed on top surfaces and on sidewalls of the fins 121, 122, 123 of fin structure 120. The dielectric layers 130a, 130b may be formed, for example, by growing an oxide of silicon (e.g., silicon dioxide) on the exterior surfaces of the fins 111, 112, 113 of the fin structure 110 and on the exterior surfaces of the fins 121, 122, 123 of fin structure 120 with an oxidation process. The dielectric layers 130 may be associated with the formation of gate dielectrics for field-effect transistors in other regions of the substrate 105.

Figure 5:
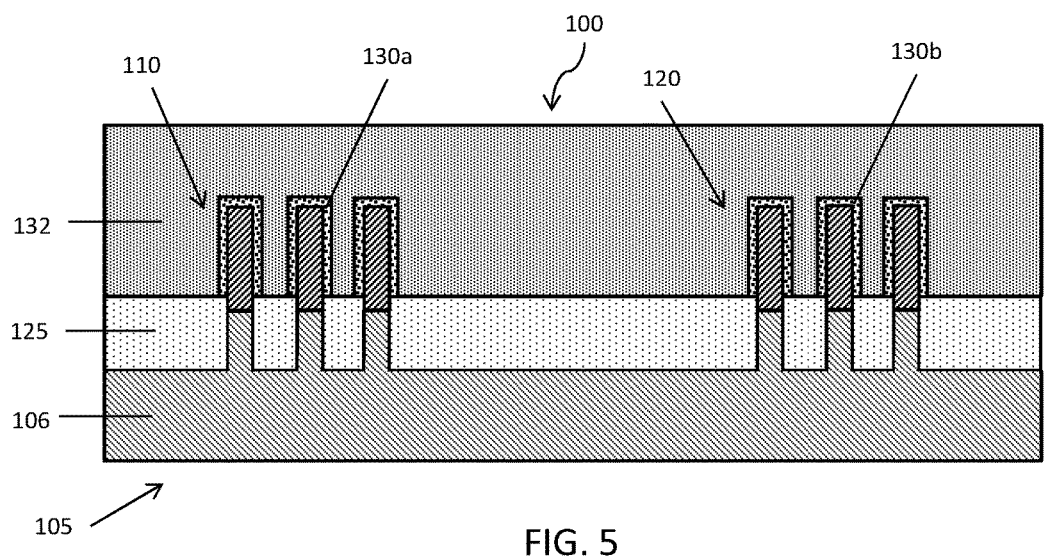

With reference to FIG. 5 in which like reference numerals refer to like features in FIG. 4 and at a subsequent fabrication stage of the processing method, a gate material layer 132 is deposited over structure 100. The gate material layer 132 may be composed of a doped semiconductor material, such as doped polycrystalline silicon (polysilicon or poly-Si). Gate material layer 132 may be deposited by, for example, a chemical vapor deposition (CVD) process and may subsequently be planarized, such as by a chemical-mechanical polishing (CMP) process. The gate material layer 132 may be associated with the formation of gate structures for field-effect transistors in other regions of the substrate 105. The thickness of the gate material layer 132 is greater than the height of the fins 111, 112, 113 and the height of the fins 121, 122, 123.

Figure 6:
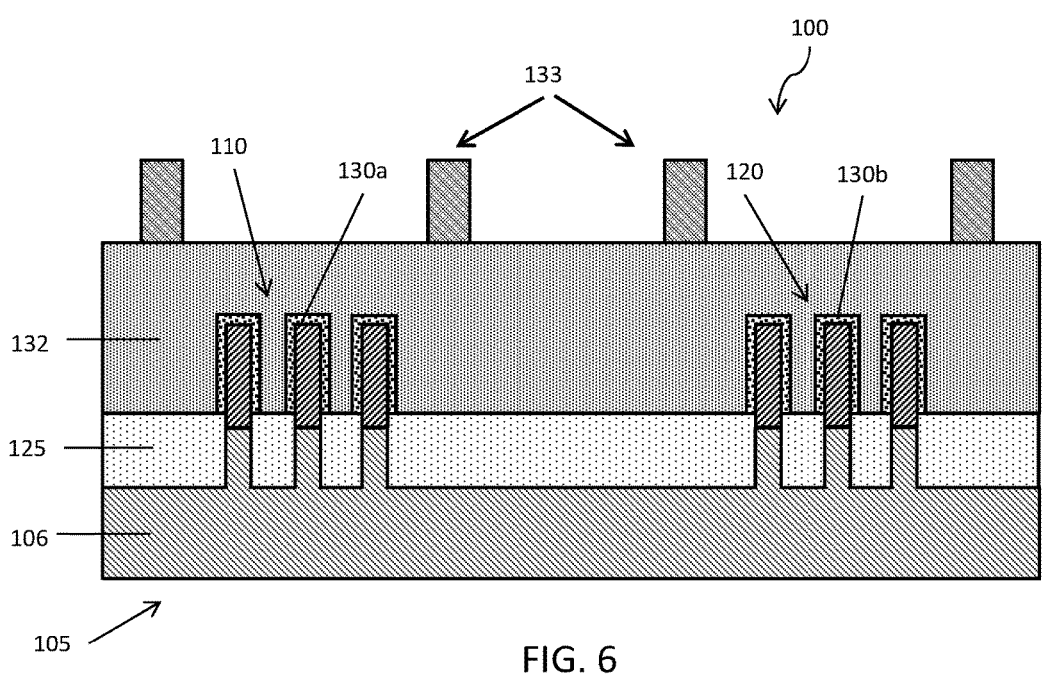

With reference to FIG. 6 in which like reference numerals refer to like features in FIG. 5 and at a subsequent fabrication stage of the processing method, a patterned etch mask 133 is formed over gate material layer 132. Patterned etch mask 133 may be formed, for example, by forming a lithographic stack over gate material layer 132 and then patterning the lithographic stack to form openings in the lithographic stack. The patterned etch mask 133 protects underlying portions of gate material layer 132 corresponding to intended locations for gate structures 141, 142, 143, 144 to be formed as illustrated in FIGS. 7 and 7A.

Figure 7:
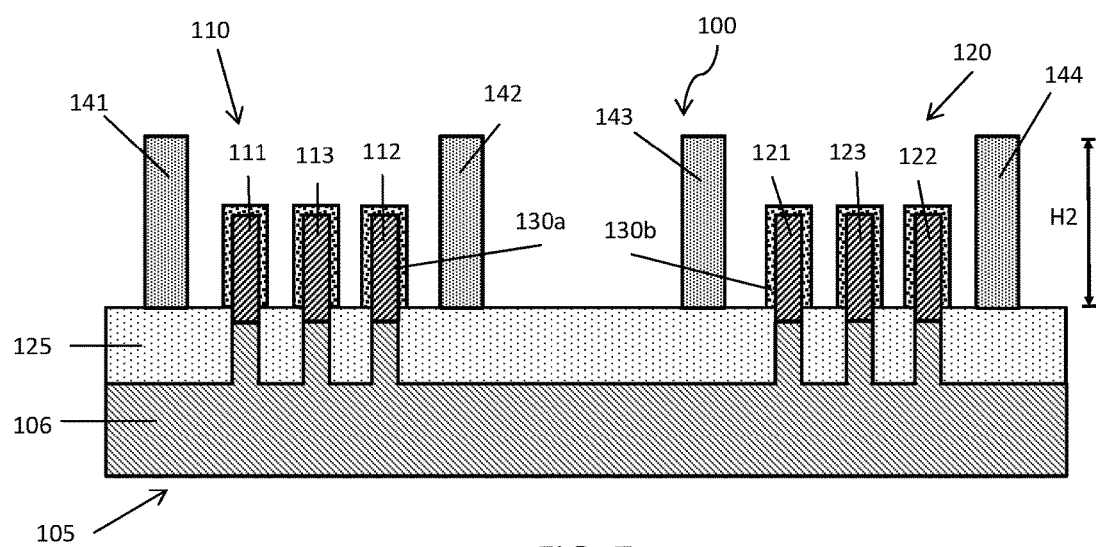
Figure 7A:
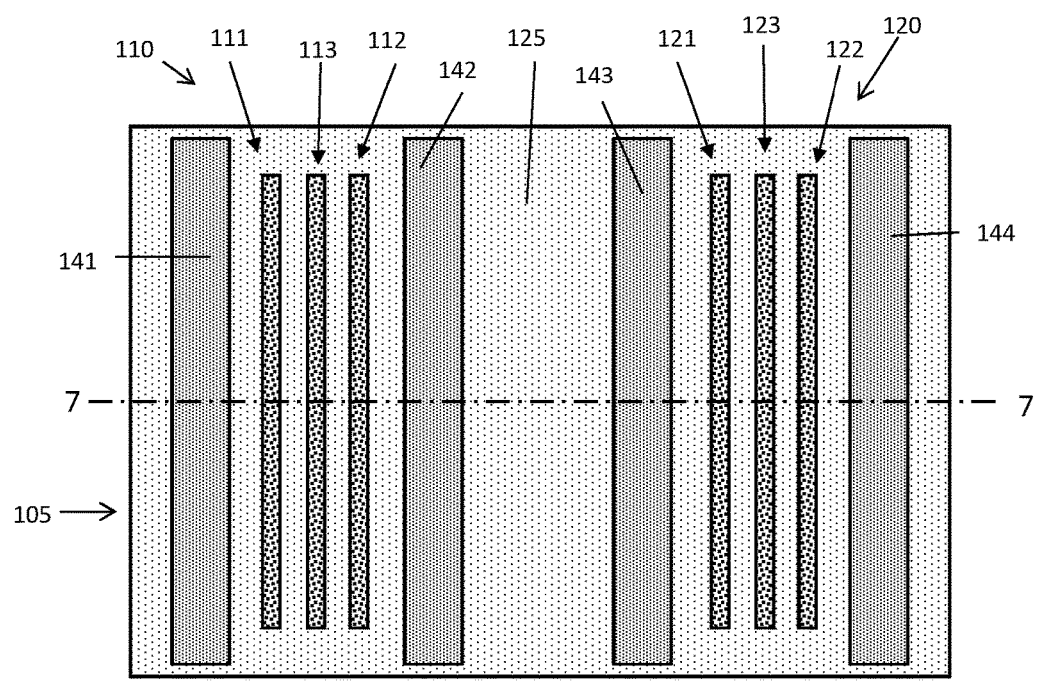

With reference to FIGS. 7 and 7A in which like reference numerals refer to like features in FIG. 6 and at a subsequent fabrication stage of the processing method, gate structures 141, 142, 143, 144 are formed by etching exposed portions of gate material layer 132. Patterned etch mask 133 is stripped after the gate structures 141, 142, 143, 144 are defined by the etching process. Gate material layer 132 may be etched, for example, via an anisotropic etch process selective to the material of gate material layer 132. Gate dielectric material 131 may be etched with gate material layer 132 or may be etched separately from gate material layer 132.

The gate structures 141, 142, 143, 144 are arranged on the top surface of the shallow trench isolation region 125. Gate structure 141 is formed adjacent and parallel to outer fin 111 of fin structure 110, and gate structure 142 is formed adjacent and parallel to outer fin 112 of fin structure 110. Similarly, gate structure 143 is formed adjacent and parallel to outer fin 121 of fin structure 120, and gate structure 144 is formed adjacent and parallel to outer fin 122 of fin structure 120. Similar gate structures for field-effect transistors may be formed from the gate material layer 132 in other regions of the substrate 105. The fins 111, 112, 113 are arranged laterally between the gate structure 141 and the second gate structure 142, and the fins 121, 122, 123 are arranged laterally between the gate structure 143 and the second gate structure 144. The layout in which the gate structures 141, 142 are aligned parallel to the fins 111, 112, 113 and also the layout in which the gate structures 143, 143 are aligned parallel to the fins 121, 122, 123 contrasts with conventional layouts in which the gate structures are aligned perpendicular to and cross the fins.

The gate structures 141, 142 and gate structures 143, 144 have heights H2 relative to the top surface 126 of the shallow trench isolation region 125 that are directly related to the thickness of the gate material layer 132. The heights of the gate structures 141, 142 and gate structures 143, 144 are greater than the heights of the fins 111, 112, 113 and fins 121, 122, 123 relative to the top surface 126 of the shallow trench isolation region 125. In other words, the top surfaces of the fins 111, 112, 113 and fins 121, 122, 123 are arranged below the top surfaces of gate structures 141, 142 and gate structures 143, 144. The gate structures 141, 142 and gate structures 143, 144 are dummy structures that are not electrically wired in the completed device structure.

Figure 8:
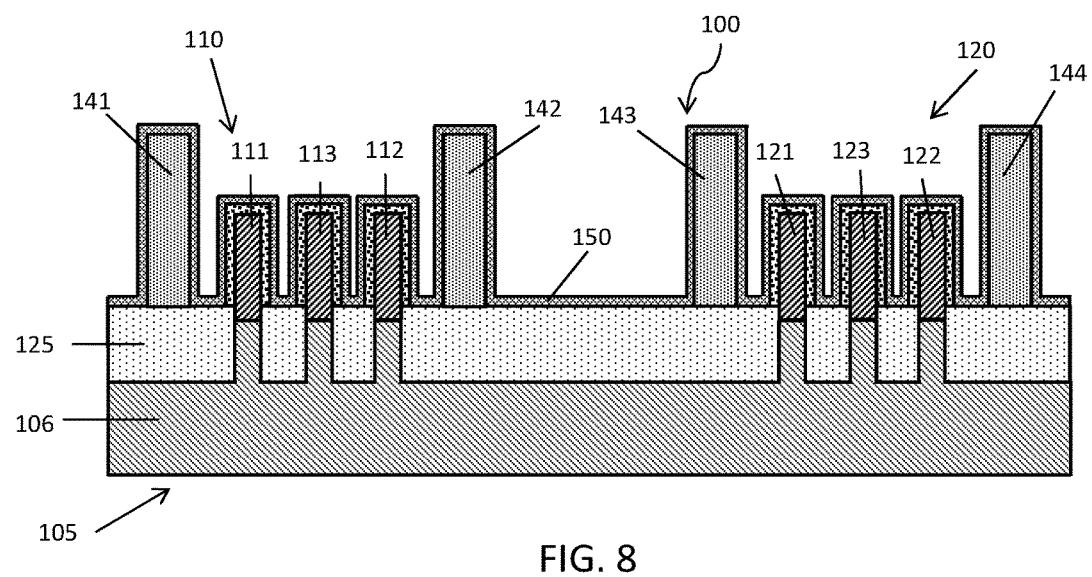

With reference to FIG. 8 in which like reference numerals refer to like features in FIGS. 7 and 7A and at a subsequent fabrication stage of the processing method, a conformal dielectric layer 150 is formed over gate structures 141, 142, 143, 144, fin structures 110 and 120, and shallow trench isolation region 125. The conformal dielectric layer 150 may be formed, for example, by chemical vapor deposition (CVD) or atomic layer deposition (ALD) of a gate spacer dielectric material, such as a nitride of silicon or an oxide of silicon. The conformal dielectric layer 150 may be associated with the formation of gate spacers for field-effect transistors in other regions of the substrate 105.

Figure 9:
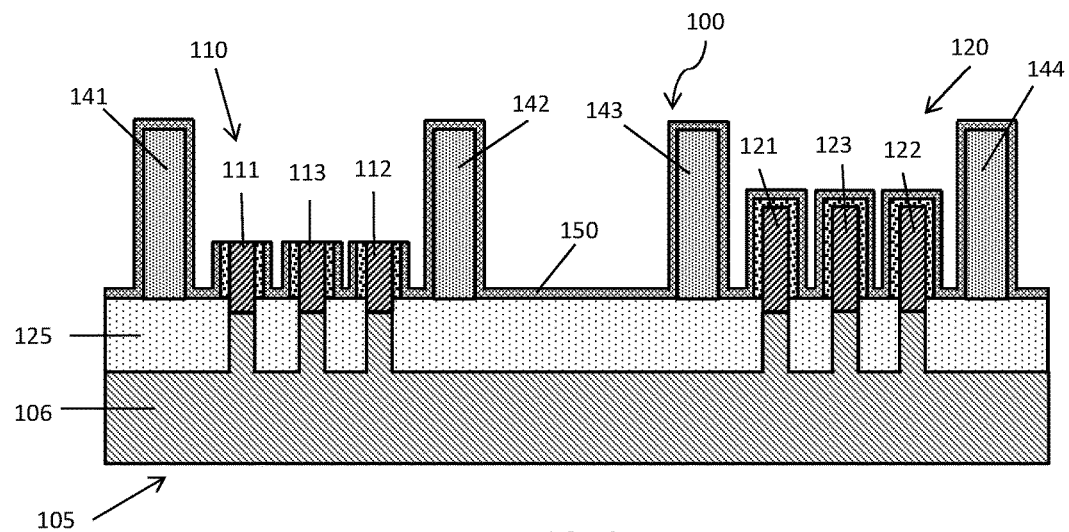

With reference to FIG. 9 in which like reference numerals refer to like features in FIG. 8 and at a subsequent fabrication stage of the processing method, fins 111, 112, 113 are etched and partially removed, and upper surfaces of fins 111, 112, 113 are exposed following etching. The fins 121, 122, 123, gate structures 141, 142, and gate structures 143, 144 may be masked by an etch mask during etching. Conformal dielectric layer 150 and dielectric layers 130a may be removed from top surfaces and portions of sidewalls of fins 111, 112, 113, such as by one or more reactive-ion etch (RIE) processes of given etch chemistries, followed by etching of fins 111, 112, 113 to reduce their height using, for example, an RIE processes of a given etch chemistry.

Figure 10:
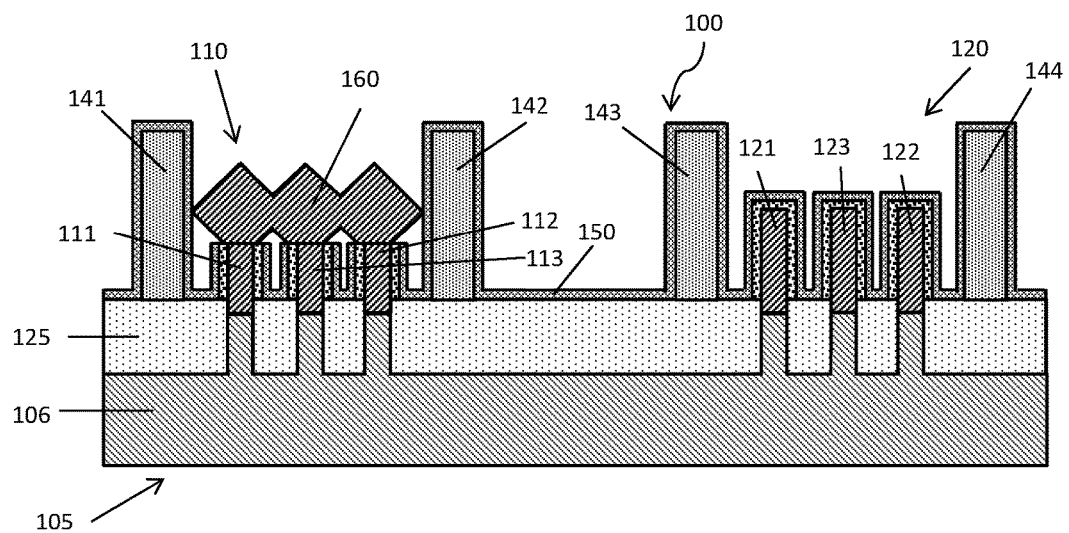

With reference to FIG. 10 in which like reference numerals refer to like features in FIG. 9 and at a subsequent fabrication stage of the processing method, a contact structure 160 is formed over fin structure 110 and is coupled with the fins 111, 112, 113. Contact structure 160 may be formed by epitaxial growth of a doped semiconductor material from the exposed top surfaces of the fins 111, 112, 113. The doped semiconductor material includes a dopant having a conductivity type, such as a p-type dopant, opposite from the conductivity type of doped well 106 (e.g., n-type). In an embodiment, the contact structure 160 may be heavily doped. Fin structure 120 is masked by the conformal dielectric layer 150 on the fins 121, 122, 123 during growth of the doped semiconductor material. The contact structure 160 is raised or spaced above the top surface 126 of the shallow trench isolation region 125.

As shown in FIG. 10, the epitaxially-grown semiconductor material of the contact structure 160 may form faceted shapes over fins 111, 112, 113. As epitaxial growth continues, the faceted shapes of growing material may merge to form the contact structure 160. Conformal dielectric layer 150 and dielectric layers 130a may restrict vertical growth of the doped semiconductor material as it is grown on fins 111, 112, 113, so that contact structure 160 only forms over upper surfaces of fin structure 110 and does not grow from sidewalls of the fins 111, 112, 113 covered by dielectric layers 130a. The fins 111, 112, 113 are coupled together by the contact structure 160.

The contact structure 160 is laterally arranged between the gate structure 141 and the gate structure 142. Gate structures 141 and 142 laterally confine the epitaxial growth of the doped semiconductor material as a physical barrier so that the outer edges of contact structure 160 respectively contact the gate structure 141 and the gate structure 142. More specifically, the outer edges of contact structure 160 directly contact respective sections of the conformal dielectric layer 150 covering the gate structures 141 and 142. The doped semiconductor material of the contact structure 160 is arranged laterally between the gate structure 141 and the gate structure 142, and does not grow across and over the gate structures 141, 142 because, at least in part, the fins 111, 112, 113 are shorter than the gate structures 141, 142. The conformal dielectric layer 150 is located on and covers the gate structures 141, 142 and prevents growth of the semiconductor material from the exterior surfaces of the gate structures 141, 142. Likewise, the fins 121, 122, 123 are covered by the conformal dielectric layer 150 and the dielectric layers 130b during epitaxial growth.

As further illustrated in FIG. 10, the epitaxially-grown contact structure 160 may thermally annealed to diffuse dopant from contact structure 160 into fins 111, 112, 113 of fin structure 110, so that the upper sections of the fins 111, 112, 113 have the same conductivity type as contact structure 160. The lower sections of the fins 11, 112, 113 have the same conductivity type as the doped well 106 and an opposite conductivity type from the contact structure 160. Alternatively, dopant diffusion may occur during the epitaxial growth of contact structure 160 if, for example, the substrate 105 is heated during the epitaxial growth process. Each of the fins 111, 112, 113 includes sections of semiconductor material of opposite conductivity types along its height. A diode junction or p-n junction is formed at the juncture of the sections of opposite conductivity types in the fins 111, 112, 113. In an embodiment, the junction may be located near the top surface of the shallow trench isolation region 125.

Figure 11:
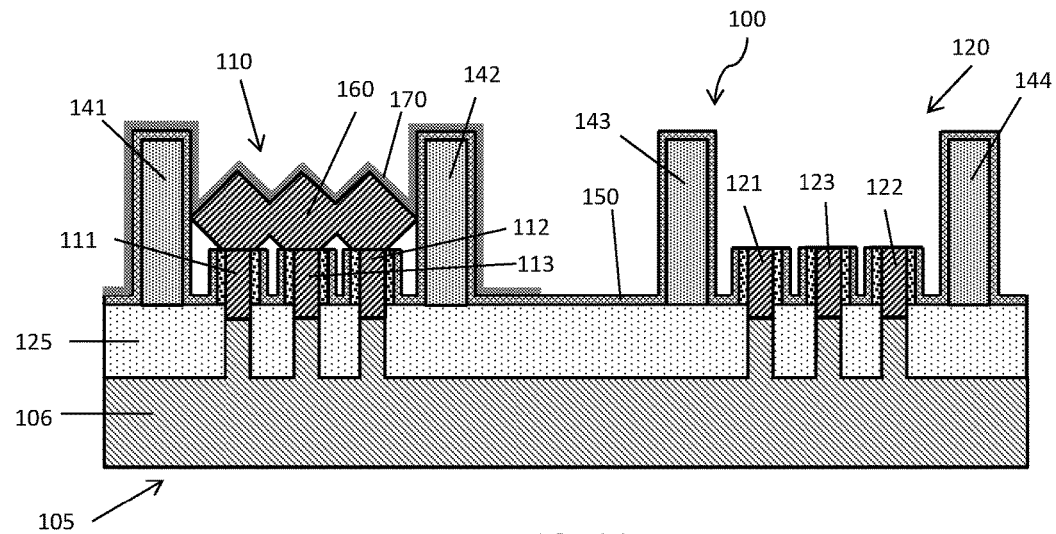

With reference to FIG. 11 in which like reference numerals refer to like features in FIG. 10 and at a subsequent fabrication stage of the processing method, fins 121, 122, 123 of fin structure 120 are etched and partially removed, and upper surfaces of fins 121, 122, 123 are exposed following etching. Fin structure 110, gate structures 141, 142, and contact structure 160 are masked by a protect layer 170 during the etching process. Conformal dielectric layer 150 and dielectric layers 130b may be removed from top surfaces and portions of sidewalls of fins 121, 122, 123, such as by one or more reactive-ion etch (RIE) processes of given etch chemistries, followed by etching of fins 121, 122, 113 to reduce their height using, for example, an RIE process of a given etch chemistry.

Figure 12:
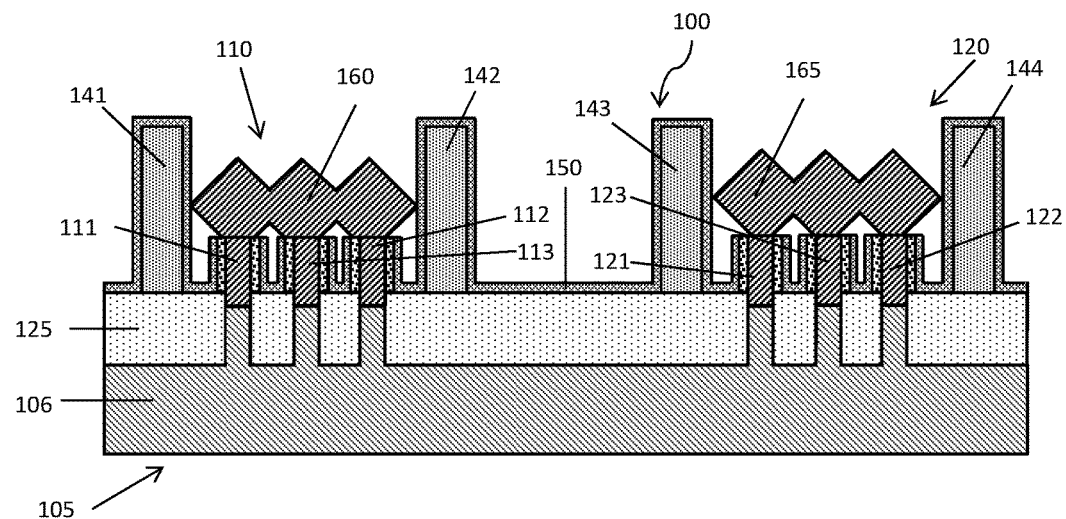

With reference to FIG. 12 in which like reference numerals refer to like features in FIG. 11 and at a subsequent fabrication stage of the processing method, a contact structure 165 is formed over fin structure 120 and is coupled with the fins 121, 122, 123. Contact structure 165 may be formed by epitaxial growth of a doped semiconductor material from the exposed top surfaces of fin structure 120. The doped semiconductor material of the contact structure 165 includes a dopant having a conductivity type, such as an n-type dopant, opposite to the conductivity type of contact structure 160 and the same conductivity type as doped well 106 (e.g., n-type). In an embodiment, the contact structure 165 may be heavily doped. The contact structure 165 is raised or spaced above the top surface 126 of the shallow trench isolation region 125.

Contact structure 160 is masked by the protect layer 170 to prevent growth from exterior surfaces of the contact structure 160, and the protect layer 170 is removed after the contact structure 165 is formed. An interlayer dielectric layer (not shown) may be formed over the device structure after the protect layer 170 is removed.

As shown in FIG. 12, the epitaxially-grown semiconductor material may form faceted shapes over fins 121, 122, 123. As epitaxial growth continues, the faceted shapes of growing material may merge to form the contact structure 165. Conformal dielectric layer 150 and dielectric layers 130a may restrict vertical growth of the doped semiconductor material as it is grown from fins 121, 122, 123, so that contact structure 160 only forms over upper surfaces of fin structure 120 and does not grow from sidewalls of the fins 121, 122, 123 covered by dielectric layers 130a. The protect layer 150 covers the contact structure 160 and prevents growth of the semiconductor material from the exterior surfaces of the contact structure 160. The fins 121, 122, 123 are coupled together by the contact structure 165.

The contact structure 165 is laterally arranged between the gate structure 143 and the gate structure 144. Gate structures 143 and 144 laterally confine the epitaxial growth of the doped semiconductor material as a physical barrier so that the outer edges of contact structure 165 respectively contact the gate structure 143 and the gate structure 144. More specifically, the outer edges of contact structure 165 directly contact respective sections of the conformal dielectric layer 150 covering the gate structures 143 and 144. The doped semiconductor material of the contact structure 165 is arranged laterally between the gate structure 143 and the gate structure 144, and does not grow and over across the gate structures 143, 144 because, at least in part, the fins 121, 122, 123 are shorter than the gate structures 143, 144. The conformal dielectric layer 150 is located on and covers the gate structures 141, 142 and prevents growth of the semiconductor material from the exterior surfaces of the gate structures 141, 142.

As further illustrated in FIG. 12, the epitaxially-grown contact structure 165 may be thermally annealed to diffuse dopant from contact structure 165 into fins 121, 122, 123 of fin structure 120, so that fins 121, 122, 123 have the same conductivity type as contact structure 165. Alternatively, the dopant diffusion may occur during the epitaxial growth of contact structure 165 if, for example, the substrate 105 is heated during the epitaxial growth process. Each of the fins 121, 122, 123 includes semiconductor material of the same conductivity type along its height and of the same conductivity type as the doped well 106 and the contact structure 165.

The order of the formation of contact structure 160 and contact structure 165 as shown in FIGS. 9-12 may be switched. Contact structure 160 and fin structure 110 may form an anode of a fin-based diode structure where contact structure 160 and upper sections of the fins 111, 112, 113 include a p-type dopant, and contact structure 165 and fin structure 120 may form a cathode of the fin-based diode structure where contact structure 165 and fin structure 120 include an n-type dopant. Contact structure 165 and the upper section of the fin structure 120 may be doped with the same n-type dopant as doped well 106 or may be doped with a different n-type dopant than doped well 106. The doped well 106 extends beneath the fins 111, 112, 113 and also extends beneath the fins 121, 122, 123, which couples fins 111, 112, 113 with fins 121, 122, 123 to contribute to the formation of the fin-based diode structure.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device structure formed using a substrate, the device structure comprising:
   a first gate structure;
   a second gate structure arranged parallel to the first gate structure;
   a first fin and a second fin each extending vertically from a top surface of the substrate, the first fin and the second fin arranged between and parallel to the first gate structure and the second gate structure; and
   a first contact structure coupled with the first fin and the second fin,
   wherein the first contact structure is laterally arranged between the first gate structure and the second gate structure.

2. The device structure of claim 1 further comprising:
   a shallow trench isolation region surrounding the first fin and the second fin,
   wherein the first gate structure and the second gate structure are arranged on the top surface of the shallow trench isolation region.

3. The device structure of claim 2 wherein the first fin and the second fin have a first height relative to the top surface of the shallow trench isolation region, the first gate structure and the second gate structure have a second height relative to the top surface of the shallow trench isolation region, and the second height is greater than the first height.

4. The device structure of claim 3 wherein the first contact structure is spaced above the top surface of the shallow trench isolation region.

5. The device structure of claim 1 wherein a first portion of the first contact structure is in contact with the first gate structure and a second portion of the first contact structure is in contact with the second gate structure.

6. The device structure of claim 5 further comprising:
   a conformal dielectric layer on the first gate structure and on the second gate structure,
   wherein the first portion of the first contact structure is in direct contact with a first section of the conformal dielectric layer on the first gate structure and the second portion of the first contact structure is in direct contact with a second section of the conformal dielectric layer on the second gate structure.

7. The device structure of claim 1 wherein the first fin and the second fin have a conductivity type, and further comprising:
   a well in the substrate below the first fin and the second fin, the well having the conductivity type of the first fin and the second fin.

8. The device structure of claim 1 wherein the first fin and the second fin each have a first section of a first conductivity type, and further comprising:
   a well in the substrate below the first fin and the second fin, the well having a second conductivity type opposite from the first conductivity type.

9. The device structure of claim 8 wherein the first fin has a second section of the second conductivity type arranged vertically between the first section of the first fin and the well, the second fin has a second section of the second conductivity type arranged vertically between the first section of the second fin and the second section of the second fin, the first section of the first fin and the second section of the first fin participate in forming a diode junction, and the first section of the second fin and the second section of the second fin further participate in forming the diode junction.

10. The device structure of claim 9 further comprising:
    a shallow trench isolation region surrounding the first fin and the second fin,
    wherein the shallow trench isolation region has a top surface, and the second section of the first fin and the second section of the second fin are arranged beneath the top surface of the shallow trench isolation region.

11. The device structure of claim 10 wherein the first gate structure and the second gate structure are positioned on the top surface of the shallow trench isolation region.

12. The device structure of claim 9 further comprising:
    a third gate structure;
    a fourth gate structure arranged parallel to the third gate structure;
    a third fin and a fourth fin each extending vertically from the substrate, the third fin and the fourth fin arranged between the third gate structure and the fourth gate structure; and a second contact structure coupled with the first fin and the second fin, wherein the second contact structure is laterally arranged between the third gate structure and the fourth gate structure, and the second contact structure has the second conductivity type.

13. The device structure of claim 12 wherein the well extends beneath the third fin and the fourth fin, and the third fin and the fourth fin have the second conductivity type.

14. The device structure of claim 12 wherein the well couples the third fin and the fourth fin with the first fin and the second fin to form a fin-based diode structure.

15. A method comprising:

forming a first fin and a second fin each extending vertically from a substrate;

depositing a gate material layer over the substrate;

patterning the gate material layer to form a first gate structure and a second gate structure arranged parallel to the first gate structure; and after patterning the gate material layer, epitaxially growing a first semiconductor material from the first fin and the second fin, wherein the first fin and the second fin are arranged between and parallel to the first gate structure and the second gate structure, and the first semiconductor material is laterally arranged between the first gate structure and the second gate structure.

16. The method of claim 15 further comprising:

forming a shallow trench isolation region surrounding the first fin and the second fin, wherein the gate material layer is deposited on the shallow trench isolation region.

17. The method of claim 16 wherein the first fin and the second fin have a height relative to a top surface of the shallow trench isolation region, and the gate material layer has a thickness that is greater than the height of the first fin and the second fin.

18. The method of claim 15 wherein the first fin and the second fin each have a first section of a first conductivity type, and further comprising:

forming a well in the substrate below the first fin and the second fin, wherein the well has a second conductivity type opposite from the first conductivity type.

19. The method of claim 18 wherein the first fin has a second section of the second conductivity type arranged vertically between the first section of the first fin and the well, the second fin has a second section of the second conductivity type arranged vertically between the first section of the second fin and the second section of the second fin, the first section of the first fin and the second section of the first fin participate in forming a diode junction, and the first section of the second fin and the second section of the second fin further participate in forming the diode junction.

20. The method of claim 19 further comprising:

forming a third gate structure and a fourth gate structure arranged parallel to the third gate structure;

forming a third fin and a fourth fin each extending vertically from the substrate, the third fin and the fourth fin arranged between the third gate structure and the fourth gate structure; and epitaxially growing a second semiconductor material from the first fin and the second fin, wherein the second semiconductor material is laterally arranged between the third gate structure and the fourth gate structure, the second semiconductor material has the second conductivity type, the well extends beneath the third fin and the fourth fin to couple the third fin and the fourth fin with the first fin and the second fin to form a fin diode, and the third fin and the fourth fin have the second conductivity type.

* * * * *

UNITED STATES PATENT AND TRADEMARK OFFICE
CERTIFICATE OF CORRECTION

PATENT NO.         : 10,096,587 B1                                            Page 1 of 1
APPLICATION NO.    : 15/794688
DATED              : October 9, 2018
INVENTOR(S)        : Yu et al.

It is certified that error appears in the above-identified patent and that said Letters Patent is hereby corrected as shown below:

In the Claims

Column 10, Claim 20, Line 27, change "first" to --third-- and "second" to --fourth--

Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*